United States Patent [19]

Juan

[11] Patent Number: 4,672,742
[45] Date of Patent: Jun. 16, 1987

[54] PROCESS FOR ASSEMBLING AND CONNECTING INTEGRATED CIRCUITS TO CIRCUIT UNITS AND APPARATUS FOR CARRYING OUT THE PROCESS

[75] Inventor: Alain Juan, Chézard, Switzerland

[73] Assignee: ETA SA Fabriques d'Ebauches, Granges, Switzerland

[21] Appl. No.: 787,895

[22] Filed: Oct. 16, 1985

[30] Foreign Application Priority Data

Oct. 30, 1984 [FR] France .................. 84 16748

[51] Int. Cl.$^4$ .................. H05K 3/34; B23P 19/00
[52] U.S. Cl. .................. 29/840; 29/740; 156/362; 228/49.1
[58] Field of Search .................. 29/740, 840; 228/49.1, 228/4.5; 156/362

[56] References Cited

U.S. PATENT DOCUMENTS

| | | |
|---|---|---|
| 3,559,279 | 2/1971 | Miklaszewski .................. 228/49.1 X |
| 3,698,620 | 10/1972 | Geyer .................. 228/6 |
| 3,715,258 | 2/1973 | Cunnane .................. 156/362 X |
| 3,724,068 | 4/1973 | Galli . |
| 4,342,090 | 7/1982 | Caccoma et al. .................. 29/740 X |
| 4,526,646 | 7/1985 | Suzuki et al. .................. 29/740 X |

FOREIGN PATENT DOCUMENTS 915318  11/1972  Canada .

Primary Examiner—Howard Goldberg
Assistant Examiner—Carl J. Arbes
Attorney, Agent, or Firm—Sughrue, Mion, Zinn, Macpeak and Seas

[57] ABSTRACT

The assembling of integrated circuits takes place in a welding post in which a film bearing circuit units advances step by step. Each integrated circuit is brought into the welding post by a rotating platform driven step by step in synchronism with the film. The integrated circuits are loaded in a loading post angularly separated from the welding post and very slightly separated from the exact position they should occupy following their transfer to the welding post. The position error is corrected in an alignment post by simply sliding the integrated ciruit over the platform surface. Thus three operations may be simultaneously performed (loading, alignment and welding) on three individual integrated circuits.

6 Claims, 4 Drawing Figures

PROCESS FOR ASSEMBLING AND CONNECTING INTEGRATED CIRCUITS TO CIRCUIT UNITS AND APPARATUS FOR CARRYING OUT THE PROCESS

This invention concerns a process for assembling and connecting integrated circuits to circuit units.

In particular, the invention concerns such a process in the course of which connection studs located on the periphery of one of the faces of an integrated circuit are thermically connected to the terminals of the circuit units according to the technique known as "I.L.B.", or "Inner Lead Bonding". It is to be noted that in the present description there is understood by circuit unit any set of conductors in which the integrated circuit is to be inserted. Such a set itself may be provided with one or several electric or electronic components.

BACKGROUND OF THE INVENTION

In order to practise the "I.L.B." technique, generally there is employed a ribbon in the form of a cinematographic film bearing a series of circuit units arranged in a longitudinal row to which the integrated circuits are to be respectively connected by soldering or welding the studs and the terminals. The film is driven in a stepwise manner past a welding post and the welding operation takes place by the application of a heated tool or welding tip to the studs and the respectively superposed terminals, the integrated circuit being, as may well be understood, maintained on a support normal to the welding tip.

Considering the extremely small dimensions of an integrated circuit, it is indispensable to obtain high precision alignment relative to the welding tip on the one hand and to the circuit unit to which it is to be connected on the other hand. In most cases, the misalignment must not exceed an error of 20 microns. In order to obtain such a high precision, it is usual to employ optical means such as a television circuit and to adjust the position of the integrated circuit relative to the circuit unit by means of the image captured by the camera, for example through manual displacement of the integrated circuit support along two perpendicular directions. Thus, this adjustment operation may only be obtained if the field of the camera in the welding post is disengaged, which requires lateral displacement of the welding tip before and after the alignment during each working cycle.

Moreover, the working cycle comprises a loading operation for the integrated circuit and one may thus arrive at a working cycle of 4 seconds per integrated circuit of which one second is required for the displacement of the welding tip into and out of the camera field of vision.

The invention has as its purpose to provide a process and apparatus for practising the technique of "I.L.B." coupling the required welding precision to a working rhythm clearly greater than that which has been obtained up to the present using this technique.

SUMMARY OF THE INVENTION

The initial objective is thus to provide a process for assembling integrated circuits to circuit units presented along a longitudinal row on a ribbon using a thermo compression or brazing operation of the integrated circuit studs onto the respective terminals of the circuit units of the ribbon. In the course of this process, the ribbon is caused to advance stepwise past a welding post in which the assembly takes place following precise alignment of each integrated circuit with a circuit unit of the ribbon, this process being characterized in that simultaneously there is effected on distinct integrated circuits at least one loading operation, one alignment operation and one welding operation by means of a support platform for such circuits rotatively mounted in the welding post and angularly displaceable in a stepping movement, a polar coordinate system being defined relative to the platform in a manner such that the position of an integrated circuit corresponding to satisfactory welding is on the polar axis of this system with a radius m and that each step of the platform corresponds to a phase angle displacement a in the system and in that the loading operation comprises depositing each integrated circuit on the said platform at a location of which the coordinates $[m+m_x; 3a+(a-a_x)]$ are slightly different from a whole number of phase angles a and/or from said radius m and in that the alignment operation comprises sliding each integrated circuit by a simple pushing operation effected in a plane parallel to that of the platform, to a location exactly separated relative to the welding position by a whole number of phase angles a and relative to the center of the platform by a distance corresponding to the radius m.

There results initially from these characteristics that the duration of the work cycle may be reduced by a factor of 2, that is to say almost to that of a single operation of translation of the ribbon and loading of the circuit, this total duration being for instance only of two seconds. In effect, the loading operation determines this duration, the other operations being typically shorter.

Next, in spite of the fact that the alignment of the integrated circuits is not effected in the welding post, the required precision is obtained by the simplicity thereof which consists of pushing the circuit to its correct position on the platform. The latter being moreover of a considerable mechanical rigidity, the circuits once aligned may not be displaced from their correct position until they are moved into the welding post. On the other hand, the alignment precision, integrated circuit—circuit unit, depends also on the manufacturing tolerance of the film. In case such tolerance is insufficient to enable the operation "I.L.B.", one may easily add a system (e.g. optical) enabling realignment, according to convenience, of the circuit unit.

Finally, the various positions of the platform attained at each step of its movement, may readily be indexed while, on the other hand, the variations of ambient temperature have only a negligible influence on the correct position of the integrated circuits.

A further object of the invention is to provide a machine or apparatus putting into practice the process as outlined hereinabove.

DESCRIPTION OF THE PREFERRED EMBODIMENT

Figure 1:
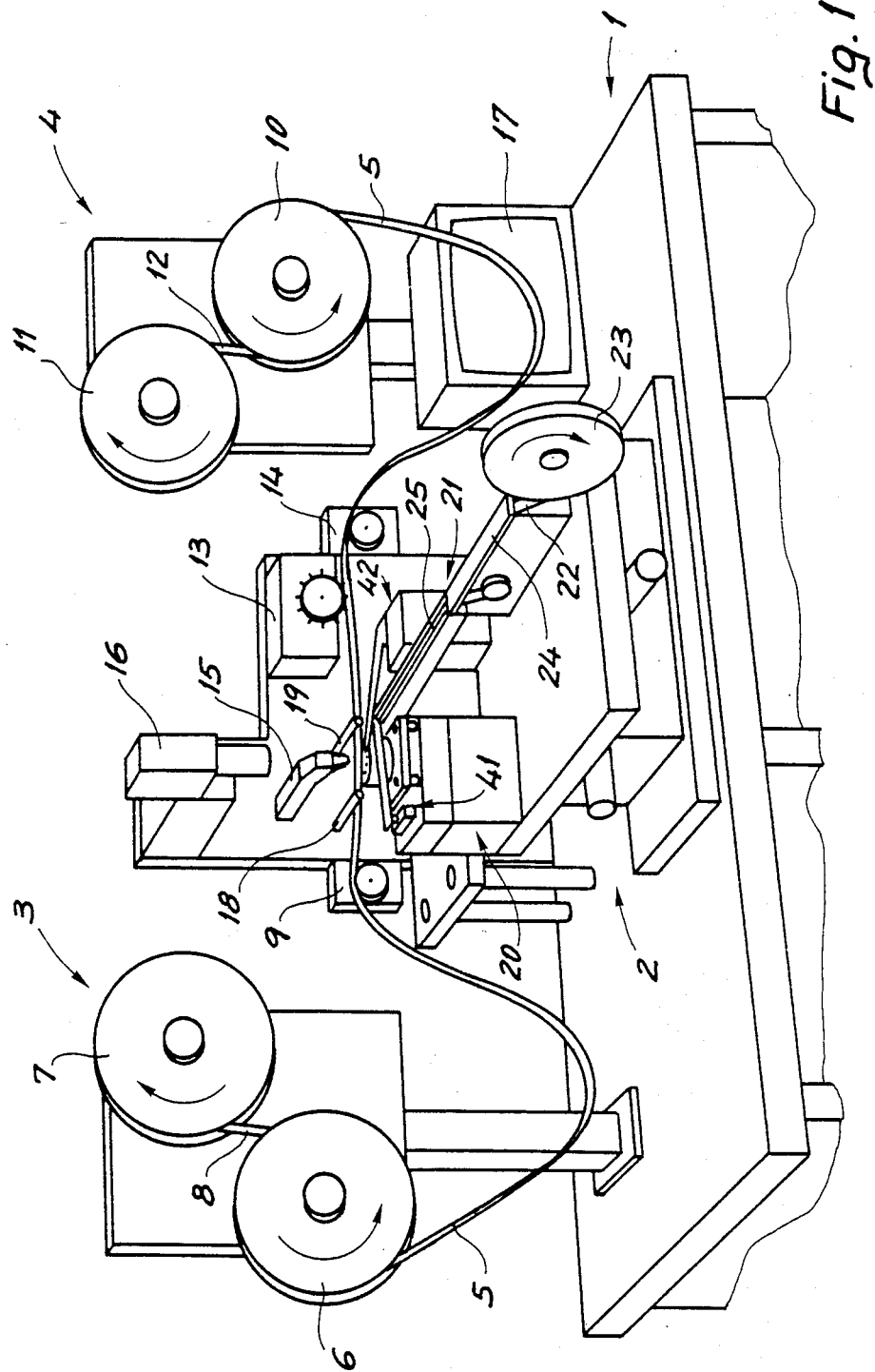
FIG. 1 is a schematic representation in perspective of an assembly apparatus for practising the process in accordance with the invention.

The perspective view of FIG. 1 shows an apparatus for assembling integrated circuits which comprises a framework 1 on which is mounted a work unit 2 placed in the center of the framework, a feed unit 3 here found at the left of the work unit 2 as well as a receiving unit 4 provided on the opposite side.

Figure 2:
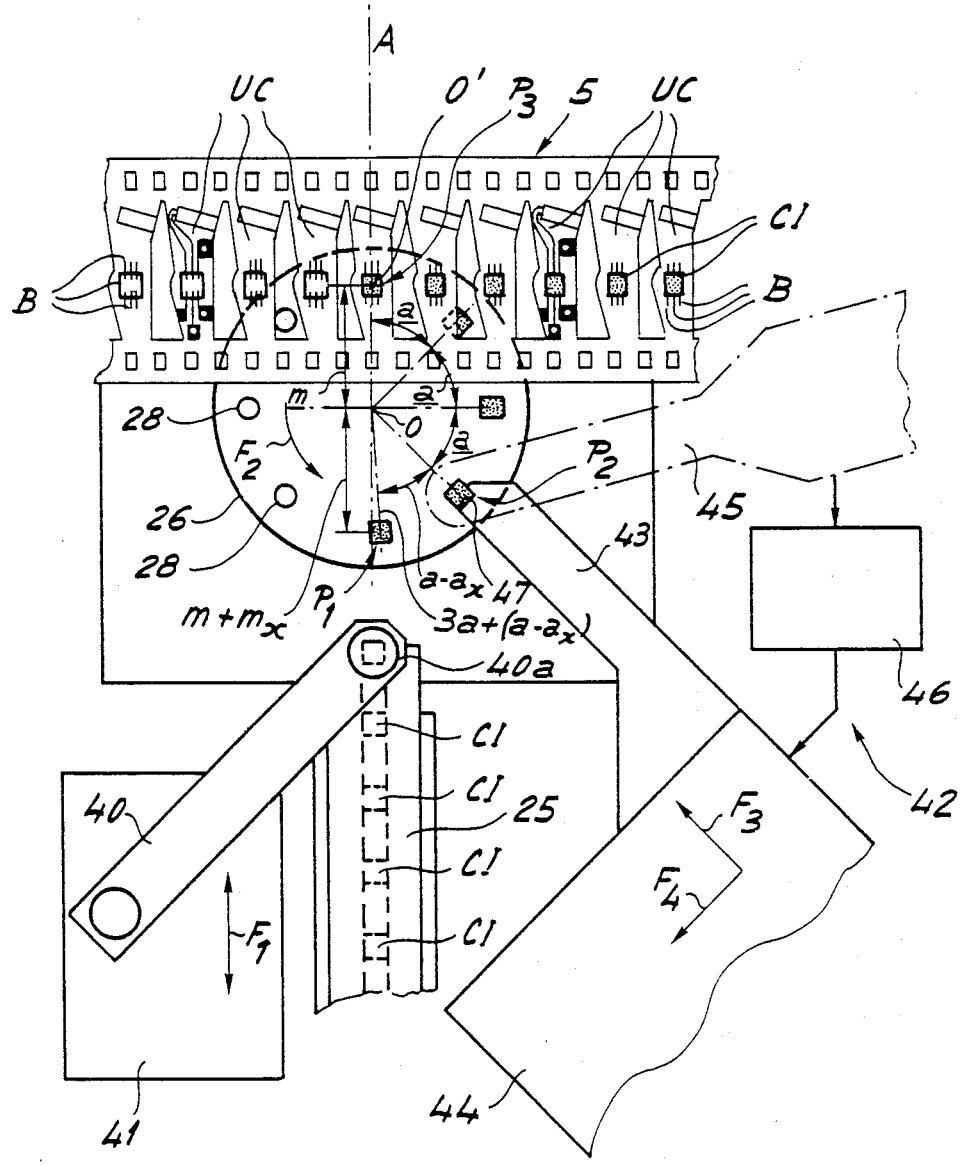
FIG. 2 is a schematic plan view of a part of the machine essential for the invention.

In a well-known manner, the apparatus according to the invention employs a ribbon 5 in the form of a cinematographic film of 35 mm for instance, provided with standardized perforations (see also FIG. 2). Such film circulates between the feed unit 3 and the receiving unit 4 in passing through the work unit 2 where the integrated circuits are fastened to it. The feed unit comprises thus a feed reel 6 comprising the film reserve, a reel 7 for taking up a protective band 8 from the film and guiding and tensioning means 9. The receiving unit comprises a take-up reel 10 for the completed film and a feed reel 11 from which there is unrolled a protective band 12 which is inserted between the turns of the film on reel 10.

The film is driven step by step by motor means 13 followed by a guide 14.

A welding tip 15 is arranged in the work unit 2 in a manner such as to be capable of effecting not only a vertical movement to effect the thermo compression or brazing operation, but likewise a retracting movement towards the rear. This latter movement, which is useful only for regulating the machine, is intended to disengage the field of vision of a television camera 16 situated above the welding tool, such camera may transmit an image of the work zone of the machine to a television screen 17. It is obvious that this arrangement may likewise be exploited for inspection of completed work.

Film 5 passes through the work unit 2 on guides 18 and 19 situated on either side of a support 20 for integrated circuits in which support the invention is incorporated.

Before describing this support in detail, it is useful to note that the integrated circuits are supplied to the work unit 2 by the aid of a loading arrangement 21 which employs an adhesive band 22 on which are cemented the previously checked integrated circuits. Such an adhesive band is described for example in U.S. Pat. No. 3,695,414. The integrated circuits are glued to this band from the silicon wafers following a test of satisfactory operation. The band 22 is unwound from a reel 23 and passes via a separation mechanism 24 from which the integrated circuits are deposited in a passage 25 which may be vibrating and which constitutes at the same time a buffer reservoir of integrated circuits from which the latter are arranged on the support 20.

FIG. 2 will now be examined, describing initially in greater detail an example of film which may be handled in the machine according to the invention.

As shown, the circuit units UC are realized on film 5 aligned in the longitudinal sense with each unit to receive one integrated circuit CI. To this effect each circuit unit UC comprises a certain number of terminals B which are respectively intended to be connected by thermo compression or brazing to corresponding studs (not shown on the drawings) of the integrated circuits, according to a technique which is well known. As may be well understood, the invention is in no manner limited to any particular circuit unit, the latter emcompassing either a simple set of conductors or possibly a set of greater complexity comprising one or several electric or electronic circuit components. For instance, if the invention is employed in the horological domain, each circuit unit UC might already be provided with an arrangement of conductors to which are connected the quartz and other associated organs. It is to be noted that on FIG. 2 only two circuit units have been shown with their conductors, this in order to avoid overloading of the drawing.

The operation which has been briefly described is known under the term "Inner Lead Bonding" and in itself presents no particular originality. In the same manner, the welding tip 15 (FIG. 1) is of a classic form, it being well understood that it is formed in order to apply simultaneously a certain quantity of heat and a certain pressure on all the superpositions of a terminal and a stud in the course of assembly.

It is likewise to be noted that the operation thus effected assures not only an electrical contact of the integrated circuit with the associated circuit unit, but further their assembly and consequently the uniting with film 5.

Figure 3:
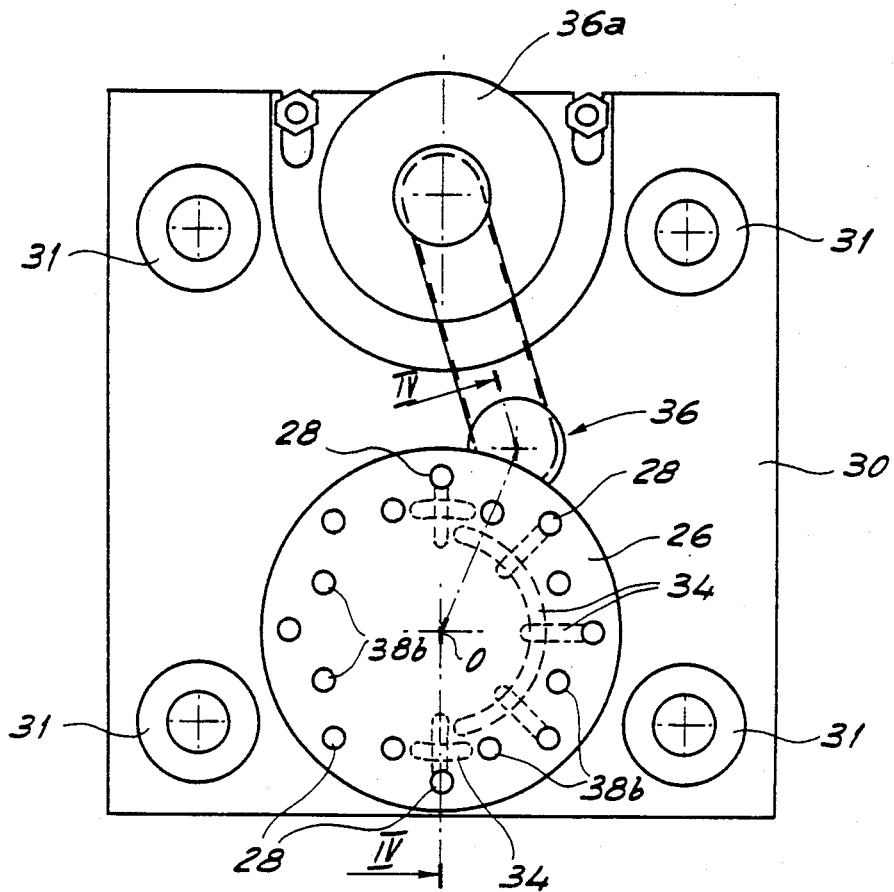
FIG. 3 shows in plan view the rotating platform and its driving mechanism employed in the machine according to FIG. 1.

In conformity with one of the essential characteristics of the invention, the integrated circuit support 20 is realized in the form of a circular platform 26 (see likewise FIGS. 3 and 4) which is rotatably mounted on a vertical axis X—X defining a center 0 at the platform surface 27.

The surface 27 is planar and preferably trued to high precision.

If one considers that point 0 is the pole of a system of polar coordinates of polar axis 0A, it is so arranged that the vertical reference axis 0' defined by the welding tip and relative to which each integrated circuit CI must be centered at the time of welding, is situated at a distance m referred to as radius. When the integrated circuit is correctly centered on this axis 0', it is then that each terminal B of a circuit unit UC will be found exactly normal to a corresponding stud of the integrated circuit whereby welding may be effected with the desired precision. It is recalled that the alignment error must be less than 20 microns, failing which the connection will not be satisfactory. In order to obtain such alignment precision, there is added in most cases a film alignment system enabling compensation for the manufacturing tolerances of the latter.

In the example shown the platform comprises eight sectors angularly separated by 45° from one another, i.e. by a phase angle a in the coordinate system which has just been mentioned. These positions are materialized by holes 28 of circular form pierced in the platform with their centers separated from the center of the surface 27 by a distance equal to the radius m.

Figure 4:
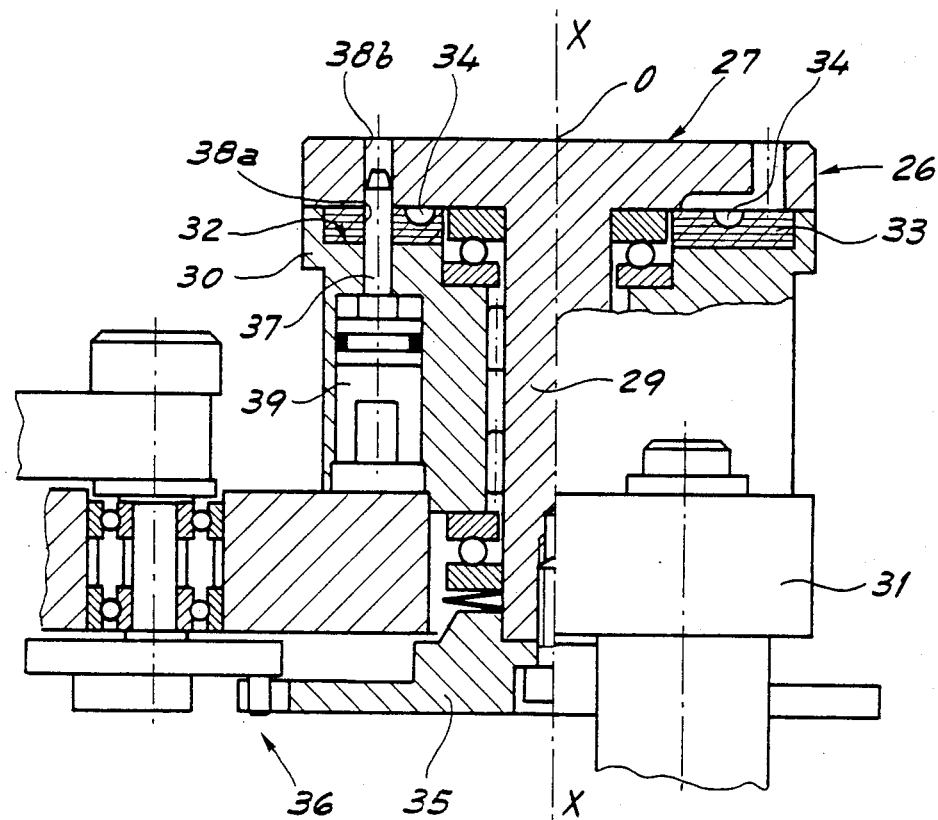
FIG. 4 shows a vertical cross-section of the platform at double the scale of FIG. 3 along the line IV—IV of FIG. 3.

FIG. 4 shows that the platform 26 is provided with a central pin 29 which extends downwardly from its lower surface and which is rotatably mounted in an underframe 30, itself mounted on four columns 31. This mounting is realized in a manner such that the assembly of the underframe 30 and the platform 26 may be vertically displaced so as to adjust the distance of the surface 27 of the platform 26 from the welding tip 15.

In the upper surface 32 of the underframe 30 is housed a ring 33 made from Teflon (registered trademark), which is provided with channels 34 serving as conduits for drawing in air. These conduits communicate on one hand with a suction source (not shown) and on the other hand selectively, with the holes 28. Pin 29 is fixed to the cross 35 of a Maltese cross mechanism 36 of well known form, driven by a motor 36a and assuring the stepping movement of platform 26. In the example as shown, the platform may occupy eight distinct positions the movement being effected in synchronism with the stepwise advance of film 5.

Finally, the underframe 30 is provided with an indexing finger 37 intended to penetrate selectively in holes 38a and 38b pierced respectively in the ring 33 and platform 26 to fix the eight positions of the latter. Such holes have not been shown on FIG. 2.

The indexing finger 37 is operated by a thruster 39 synchronously with the movements of the platform 26 and film 5.

The loading arrangement 25 comprises a loading arm 40 operating by suction and mounted on a carriage 41, movable in the horizontal plane in the direction of arrow $F_1$ of FIG. 2. The loading arm 40 is intended to transfer one by one the integrated circuits CI from the output of the reservoir 25 towards the loading position of platform 26, this position being indicated by reference $p_1$ on FIG. 2. The loading arm is provided preferably with a head 40a rotatably mounted about a vertical axis and operating by air suction. Thus, in the course of the transfer to platform 26, each integrated circuit may be positioned angularly about its own center in being turned selectively through 90°, 180° or 270° for instance.

Looked at in the sense of movement of platform 26 (shown by arrow $F_2$ on FIG. 2), there is provided an alignment mechanism 42 which comprises an alignment arm 43 mounted on a carriage 44 which is movable in translation X-Y according to arrows $F_3$ and $F_4$. The motions of arm 43 are controlled by an automatic regulating system comprising an opto-electronic detector 45, a control circuit 46 and a drive motor (not shown) coupled to carriage 44. In the example shown, the positions of loading and alignment are angularly separated by the value of the phase angle a of the polar coordinate system. There results therefrom that in the realization as shown, three positions only, among the eight possible positions on platform 26, are provided with tooling, the other positions constituting only simple wait positions. It will be likewise noted that in the course of transfer of an integrated circuit CI onto platform 26, it is maintained in position by suction from the low pressure source applied to ring 33.

In conformity with the invention, the loading of each integrated circuit on platform 26 is realized in a manner such that its position does not correspond exactly to that which it must occupy following angular translation into the welding post, i.e. under the welding tip 15. In other words, in the system of coordinates defined hereinabove, the radius of the loading position is different from the radius m of the welding position $p_3$, while the phase angle does not correspond to a whole multiple of the phase angle a defined by the angular separation between the holes 28. In the arrangement shown, the loading position $p_1$ corresponds to a radius $m+m_x$ while the phase angle corresponds to a value $3a(a-a_x)$, it being understood that $m_x$ and $a_x$ are very small and may vary from one integrated circuit to another.

Under these conditions, it is possible to correct the position of the circuit after loading by a simple sliding over the surface 27 by means of arm 43.

It will be noted that the end of this arm exhibits an L formed cut-out 47, the edges of which are intended to come into contact with two adjacent edges of the integrated circuit. In order to obtain a correct alignment, it is necessary, taking into account the inaccuracies which may arise at the time of manufacture of the integrated circuit as far as its lateral edges are concerned, to effect an optical alignment with a connection stud, this being realized by means of detector 45 and the regulation loop associated therewith. It is to be noted that the optical detector 45 is preferably that realized by the company Ciposa of Le Landeron, Switzerland, under the name "Mini-Demo" type 102-0662. The regulation loop is conceived so as to position each integrated circuit relative to a reference which is obtained from the correct welding position. In the case shown, this position has a radius m and a phase angle equal to 3a, it being understood that the alignment arm places the center of the integrated circuit exactly in coincidence with the point defined by these coordinates. In this manner, the integrated circuit will be aligned under the welding tip 15 after three steps of the platform 26.

The working cycle of the machine which has just been described proceeds in the following manner.

The integrated circuits CI are successively transferred to the loading position $p_1$ of which the coordinates are those indicated hereinabove. The circuit is maintained on the platform by suction. During this operation the integrated circuit previously loaded is aligned by means of the arm 43 and the regulation loop comprising the detector 45, the control arrangement 46 and the drive motor of the carriage 44. Simultaneously, the integrated circuit already transferred into the welding position $p_3$ is welded to the circuit unit UC which appears at that instant under the welding tip 15.

At the end of this cycle, the film 5 and the platform 26 are advanced through a step and the three preceding operations are repeated simultaneously on three integrated circuits now to be found on platform 26. Thus the work cycle is substantially shortened relative to that of machines of the prior art in which the three operations had to be effected successively in the welding post.

What I claim is:

1. Process for assembling integrated circuits with circuit units longitudinally arranged in a row along a ribbon by thermo compression welding or brazing of the integrated circuit studs to the terminals of the respective circuit units on the ribbon in which
    the ribbon is caused to advance step by step through a welding post in which the assembly takes place following precise alignment of each integrated circuit with a circuit unit on the ribbon;
    simultaneously effecting on separate integrated circuits at least a loading operation, an aligning operation and a welding operation by means of an integrated circuit support platform rotatively mounted in the welding post and angularly displaceable step by step;
    placing integrated circuits on the support platform in the correct welding position determined by a system of polar coordinates defined with respect to the platform wherein the integrated circuits are situated on the polar axis of said system at a radius m with each step of the platform equal to a phase angle displacement a in said system;
    loading said integrated circuits by depositing each one thereof on said platform at a location the coordinates of which are slightly different from a whole number of phase angles a and/or from said radius m;

aligning said integrated circuits by sliding thereof effected in a plane parallel to the platform surface to a position exactly displaced relative to the welding post by a whole number of phase angles a and relative to the platform center by a distance corresponding to the radius m.

2. Process as set forth in claim 1 in which during the alignment operation one of the integrated circuit studs has its position optically determined relative to a reference derived from the correct position of alignment and sliding of the integrated circuit is effected until nullification of the alignment error in radius and phase angle relative to said reference.

3. Process as set forth in claim 1 wherein during loading each of the integrated circuits is rotated in a plane parallel to its major surfaces and that of the platform thereby to adapt its position to that which it must occupy in the course of welding in the welding post.

4. Apparatus for assembling and connecting integrated circuits to circuit units comprising a post for welding by thermo compression or brazing, means for effecting stepping advance of a ribbon bearing said circuit units in said welding post, loading means enabling introduction one by one of the integrated circuits in the welding post normal to the respective circuit units and alignment means acting prior to each welding operation to bring the integrated circuit studs into alignment with the connection terminals of a circuit unit wherein there is provided a platform rotatively mounted on an axis vertically arranged relative to the welding post, means for driving the platform in a stepwise manner in synchronism with the ribbon movement, said platform comprising at least three locations corresponding to as many work positions angularly separated on a same circumference and passing successively normal to the welding tool during movement of the platform, said positions being respectively and simultaneously served between successive steps of the platform by said loading means, said aligning means and said welding tool, said loading means comprising a transfer arm arranged and adapted to load each integrated circuit onto the platform at the corresponding position with an angular and radial separation relative to the position which the circuit is to occupy when such position stops under the welding tool, and said alignment means comprising a pushing arm displaceable in a plane parallel to the surface of the platform so as to nullify said angular and radial separation of the integrated circuit by sliding thereof to the correct position whereby the circuit is correctly introduced under the welding tool.

5. Apparatus as set forth in claim 4 wherein said pushing arm includes an extremity exhibiting a cut out of L form the edges of which are adapted and intended to contact two lateral adjacent edges of the integrated circuits in the course of alignment.

6. Apparatus as set forth in claim 4 wherein said alignment means includes a pushing arm position regulating loop comprising an optical detector arranged to detect the position of a stud of the integrated circuit as well as means arranged to control the movement of said arm as a function of the radial and angular separation of said stud relative to the correct welding position of the integrated circuit.

* * * * *